US005854801A

United States Patent [19]

Yamada et al.

[11] Patent Number: 5,854,801

[45] Date of Patent: Dec. 29, 1998

[54] PATTERN GENERATION APPARATUS AND METHOD FOR SDRAM

[75] Inventors: Osamu Yamada, Tokorozawa; Koji Hara, Fujisawa, both of Japan

[73] Assignee: Advantest Corp., Tokyo, Japan

[21] Appl. No.: 894,870

[22] PCT Filed: Sep. 6, 1995

[86] PCT No.: PCT/JP95/01767

§ 371 Date: Jan. 20, 1998

§ 102(e) Date: Jan. 20, 1998

[51] Int. Cl.[6] .......... G01K 31/28

[52] U.S. Cl. .......... 371/27.1; 371/27.5; 371/27.6; 371/21.1

[58] Field of Search .......... 371/27.1, 27.5, 371/27.6, 21.1, 21.3; 365/201; 324/158.1, 73.1; 341/55; 395/425

[56] References Cited

U.S. PATENT DOCUMENTS

| | | | |
|---|---|---|---|
| 4,754,215 | 6/1988 | Kawai | 371/22.31 |
| 4,862,460 | 8/1989 | Yamaguchi | 371/27.6 |
| 5,214,654 | 5/1993 | Oosaura | 371/21.1 |
| 5,341,492 | 8/1994 | Sakata | 395/425 |
| 5,739,778 | 4/1998 | Tae | 341/55 |

*Primary Examiner*—Hoa T. Nguyen
*Attorney, Agent, or Firm*—Muramatsu & Associates

[57] ABSTRACT

A test pattern generation apparatus and method for an SDRAM can easily generate a test pattern for the SDRAM by having a specific wrap conversion circuit or an address conversion method. The wrap conversion circuit is provided to receive two kinds of data from a pattern generator and converts the data through a predetermined logic circuit information. The test pattern generation method for the SDRAM is carried out by inputting the column address data Y0–Y2 and the wrap address data Z0–Z2, and by generating output data which has been converted by a predetermined logic equation. The test pattern generation apparatus and method can also include an address inversion scramble for the converted output.

7 Claims, 4 Drawing Sheets

10 Pattern Generator; X0-11; 31 X Scramble; Row; 20; Y0-8; Z0-2; Wrap Conversion 40; Y0-8; Y Scramble 32; Y0-8; Column

*Fig.8*

| Transfer Order | Start Address | Binary Counter | Sequential Type | Interleave Type |
|---|---|---|---|---|
| ↓ | 010(2) | 000(0) | 010(2) | 010(2) |
| | 010(2) | 001(1) | 011(3) | 011(3) |
| | 010(2) | 010(2) | 100(4) | 000(0) |
| | 010(2) | 011(3) | 101(5) | 001(1) |
| | 010(2) | 100(4) | 110(6) | 110(6) |
| | 010(2) | 101(5) | 111(7) | 111(7) |
| | 010(2) | 110(6) | 000(0) | 100(4) |
| | 010(2) | 111(7) | 001(1) | 101(5) |

PATTERN GENERATION APPARATUS AND METHOD FOR SDRAM

TECHNICAL FIELD

This invention relates to a test pattern generation apparatus and method for generating a test pattern to test a synchronous dynamic random access memory (hereinafter referred to as "SDRAM").

BACKGROUND ART

In general, a semiconductor test system has to test various types of semiconductor devices by generating test patterns. A higher operation speed is ever desired in the recent semiconductor devices to be tested, and as a result, an SDRAM has become more common in the market.

An SDRAM has an increased operation speed by continuously accessing a block of memory cells by itself unlike the conventional DRAM which is accessed cell by cell. An SDRAM has a special architecture to speed up the continuous access, enabling a read/write rate of 100 M byte/second or higher. To increase the continuous access, the read and write process in the SDRAM is performed by a burst method. The burst method is a process in which the data for the same row address is read and written as a unit of block such as 2, 4 or 8 words. In such an operation, only the start address of a block is given, and the subsequent address thereafter is incremented within the SDRAM by itself, thereby achieving the high-speed performance.

There are two methods for incrementing the address after the start address for the continuous address block in the SDRAM, i.e., wrap types, one is a sequential type and the other is an interleave type. FIG. 8 shows an example of address sequence in the SDRAM. The example of FIG. 8 has a burst length of 8 words. When the start address for the continuous access block is given, data is transferred continuously to the block. The order of the transfer is predetermined by specifications of the SDRAM, and as shown in FIG. 8, there is a difference between the sequential wrap type and the interleave wrap type.

FIG. 7 is an example of address allocations in the wrap address. A part of the column address of the SDRAM is assigned as a wrap address for the burst operation. FIG. 6 shows an example of pattern generation in the conventional semiconductor test system. This drawing shows the relationship between the address of the SDRAM that is a device 20 to be tested and the address from a pattern generator 10. In this example, the address X0–X11 of the pattern generator is allocated to the row address of the SDRAM. The address Y0–Y2 of the pattern generator is allocated to the wrap address of the SDRAM. For the rest of column address of the SDRAM, the address Z0–Z5 of the pattern generator is assigned. The allocations of address generation are necessary in such a way that correspond to the continuous address in the device to be tested so as to prepare for the case where a failure has occurred in the device to be tested and quality analysis must be performed. Hence, the test pattern will be generated based on a mathematical function of the pattern generator.

In the pattern generator of the conventional semiconductor test system, for generating a complex pattern such as the sequential type address or the interleave type address of SDRAM for testing the SDRAM, the standard operational ability in the pattern generator cannot cover the complexity of the pattern generation. Thus, for generating such patterns, it is necessary to pre-install a complex pattern program produced by a mathematic process. In addition to the complexity, there is a problem that a start column address for the burst operation cannot be set algorithmically.

The present invention has been made to overcome the above problems in the conventional technology and provides a test pattern generation apparatus for SDRAM that can easily generate test patterns for testing the SDRAM by adding a specific wrap address conversion circuit as well as a test pattern generation method for SDRAM by converting the address from the pattern generator to the wrap address.

DISCLOSURE OF THE INVENTION

According to the first embodiment of the present invention, a test pattern generation apparatus is provided to effectively test an SDRAM. The pattern generation apparatus includes a-wrap address conversion means which is provided with two (2) kinds of data (Y0–Y2) and (Z0–Z2) from a pattern generator and outputs converted addresses which have been converted based on a predetermined logic circuit information in the conversion means.

When two kinds of input data (Y0–Y2) and (Z0–Z2) are given to the wrap address conversion means, the conversion means outputs the wrap address (Y0–Y2) expressed by the following logical equations based on the logic circuit information therein:

Y0=Y0. XOR. Z0

Y1=Y1. XOR. Z1

Y2=Y2. XOR. Z2

Or, when the two kinds of input data (Y0–Y2) and (Z0–Z2) are given to the wrap address conversion means, the conversion means outputs the wrap address (Y0–Y2) expressed by the following logical equations based on the logic circuit information therein:

Y0=Y0. XOR. Z0

Y1=(Y0. AND. Z0). XOR. (Y1. XOR. Z1)

Y2=(((Y0. AND. Z0). AND. (Y1. XOR. Z1)). OR. (Y1. AND. Z1)). XOR. (Y2. XOR. Z2)

In the second embodiment, a test pattern generation method is provided for testing the SDRAM. The test pattern generation method for testing the SDRAM is comprised of the steps of:

inputting column address data (Y0–Y2) from the pattern generator to a wrap address conversion circuit;

inputting wrap address data (Z0–Z2) from the pattern generator to the wrap address conversion circuit;

outputting a converted address (Y0–Y2) from the wrap address conversion circuit based on the following logic equations;

Y0=Y0. XOR. Z0

Y1=Y1. XOR. Z1

Y2=Y2. XOR. Z2.

Further, after the logic conversion of the above, a conversion step of an address inverse scramble can be added to the output of the logic conversion.

Alternatively, a test pattern generation method for testing the SDRAM is comprised of the steps of:

inputting column address data (Y0–Y2) from the pattern generator to a wrap address conversion circuit;

inputting wrap address data (Z0–Z2) from the pattern generator to the wrap address conversion circuit;

outputting a converted address (Y0–Y2) from the wrap address conversion circuit based on the following logic equations;

Y0=Y0. XOR. Z0

Y1=(Y0. AND. Z0). XOR. (Y1. XOR. Z1)

Y2=(((Y0. AND. Z0). AND. (Y1. XOR. Z1)). OR. (Y1. AND. Z1)). XOR. (Y2. XOR. Z2).

Further, after the logic conversion of the above, a conversion step of an address inverse scramble can be added to the output of the logic conversion.

According to the present invention, a pattern program used in the pattern generator is not complicated and can be easily produced. Further, the pattern program in the pattern generator can be commonly used in generating the wrap address between the sequential type and the interleave type because the pattern program can be expressed by an ordinary increment method.

BRIEF DESCRIPTION OF THE DRAWINGS

FIG. 8 shows and example of the address sequence in the SDRAM.

BEST MODE FOR CARRYING OUT THE INVENTION

The first embodiment of the present invention is explained with reference to the drawings.

Figure 1:
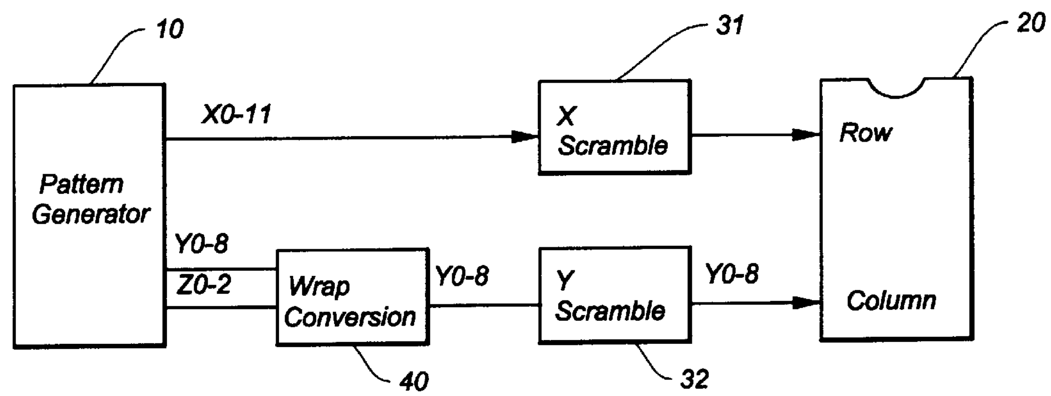
FIG. 1 is a block diagram showing an embodiment of the present invention.

FIG. 1 is a block diagram showing the first embodiment of the present invention. As shown in FIG. 1, a wrap address conversion circuit 40 is provided at an output of a pattern generator 10. For the wrap address conversion circuit 40, data (Y0–Y8) corresponding to the bit length of the column address of the SDPAM is provided from the pattern generator 10. At the same time, data (Z0–Z2) corresponding to the bit length of the wrap address of the SDRAM is provided to the wrap address conversion circuit 40 from the pattern generator 10.

Figure 4:
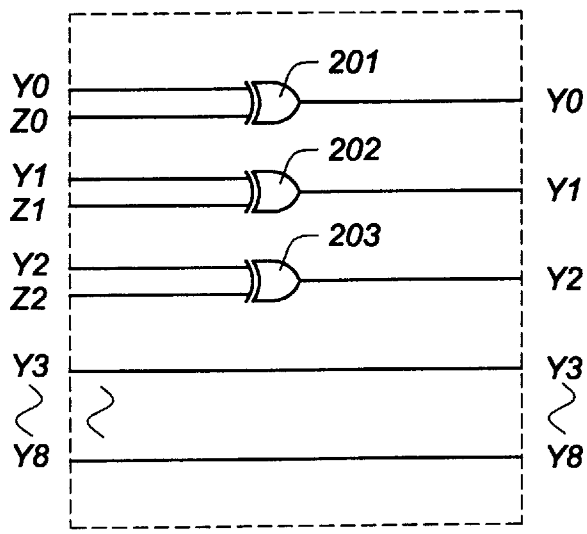
FIG. 4 is a circuit diagram showing a logic circuit structure in the wrap address conversion circuit for a interleave address mode.

The internal logic structure of the wrap address conversion circuit 40 is made as shown in FIG. 4 for the interleave address mode. In the wrap address conversion circuit 40, the data Y provided from the pattern generator 10 is converted to the address of the interleave address mode by using the data Z, and the resultant address is input to the SDRAM under test. In the wrap address conversion circuit 40, the following logic circuit information is set for the address conversion;

Y0=Y0. XOR. Z0

Y1=Y1. XOR. Z1

Y2=Y2. XOR. Z2

Figure 3:
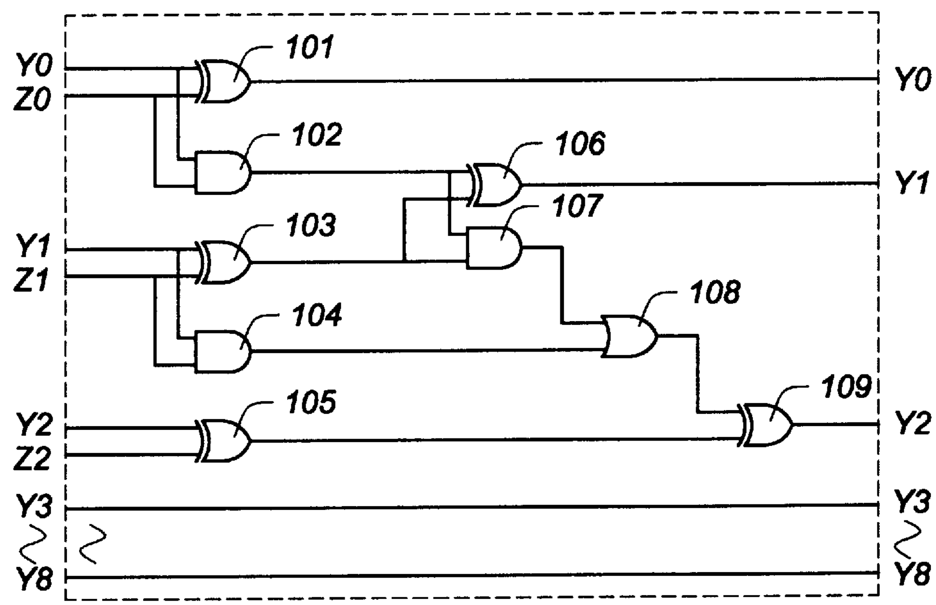
FIG. 3 is a circuit diagram showing a logic circuit structure in the wrap address conversion circuit for a sequential address mode.

The internal logic structure of the wrap address conversion circuit 40 is made as shown in FIG. 3 for the sequential address mode. In the wrap address conversion circuit 40, the data Y provided from the pattern generator 10 is converted to the address of the interleave address mode by using the data Z, and the resultant address is input to the SDRAM under test. In the wrap address conversion circuit 40, the following logic circuit information is set for the address conversion;

Y0=Y0. XOR. Z0

Y1=(Y0. AND. Z0). XOR. (Y1. XOR. Z1)

Y2=(((Y0. AND. Z0). AND. (Y1. XOR. Z1)). OR. (Y1. AND. Z1)). XOR. (Y2. XOR. Z2).

The logic circuit information can take the structure wherein the logic information can be freely renewed from the outside. In addition, the above Z data can be the data generated by the pattern generator and incremented by one.

Figure 2:
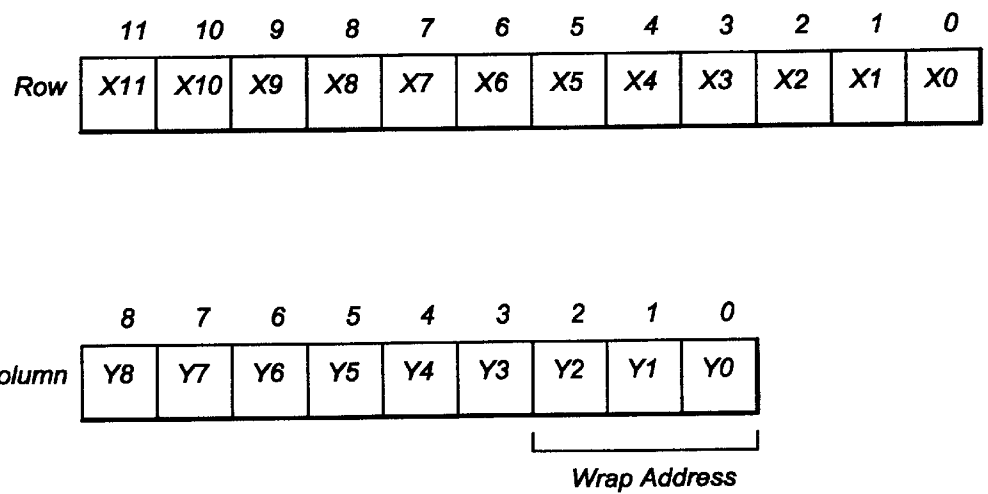
FIG. 2 is a schematic diagram showing an example of pattern generation for the row address and column address in the present invention.

FIG. 2 is a schematic diagram showing an example of pattern generation for row addresses and column addresses in the present invention. According to the address conversion described above, the resulted address that corresponds to the address change shown in FIG. 8 can be obtained by only incrementing the data Z. Hence, when the data Z0–Z2 changes in the order of address sequence of the SDRAM, each output corresponding to the sequential address or interleave address type can be obtained as the output data Y0–Y2. The start column address in the burst can be set algorithmically. The output of this wrap conversion circuit 40 is given to the device SDRAM 20 to be tested. Further, the output of the wrap conversion circuit 40 can be given to a failure analysis apparatus (not shown).

The second embodiment of the present invention is explained with reference to the drawings.

There is a case in which an address inversion scramble is needed between the pattern generator 10 and the device 20 to be tested. The address inversion scramble is used for converting the address between the logical address and the physical address of the device under test. This is a function to convert the address because the chip alignment within the device to be tested is freely designed and determined to meet the physical and operational conditions of the device for each kind of devices and such an alignment does not match the logical address given at the outside of the device. Thus, the address inversion scramble is a function necessary to perform failure analysis with respect to the internal operation of the device under test.

When both of the address inversion scramble function and the wrap conversion circuit for testing the SDRAM are to be used, an X scramble memory 31 is provided between the pattern generator 10 and the device 20 to be tested as a scrambler of the row address as shown in FIG. 1. Further, as a scrambler of the column address, a Y scramble memory 32 is provided between the wrap converter 40 and the device 20 to be tested.

The third embodiment of the present invention is explained with reference to the drawings.

Figure 5:
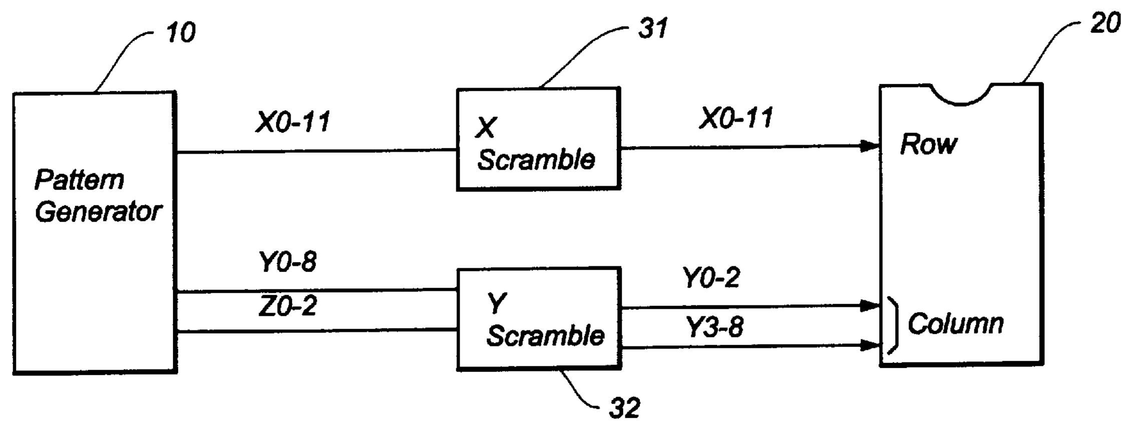
FIG. 5 is a block diagram showing an example of circuit configuration of the present invention in which both the address scramble function and the wrap address conversion function for the SDRAM are included.
Figure 6:
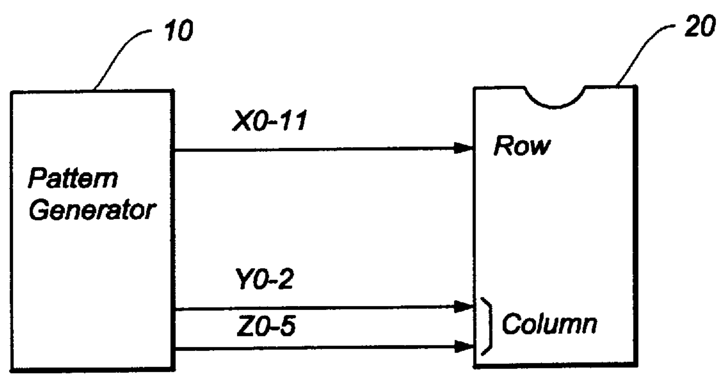
FIG. 6 is a block diagram showing an example of pattern generation in the conventional semiconductor test system.
Figure 7:
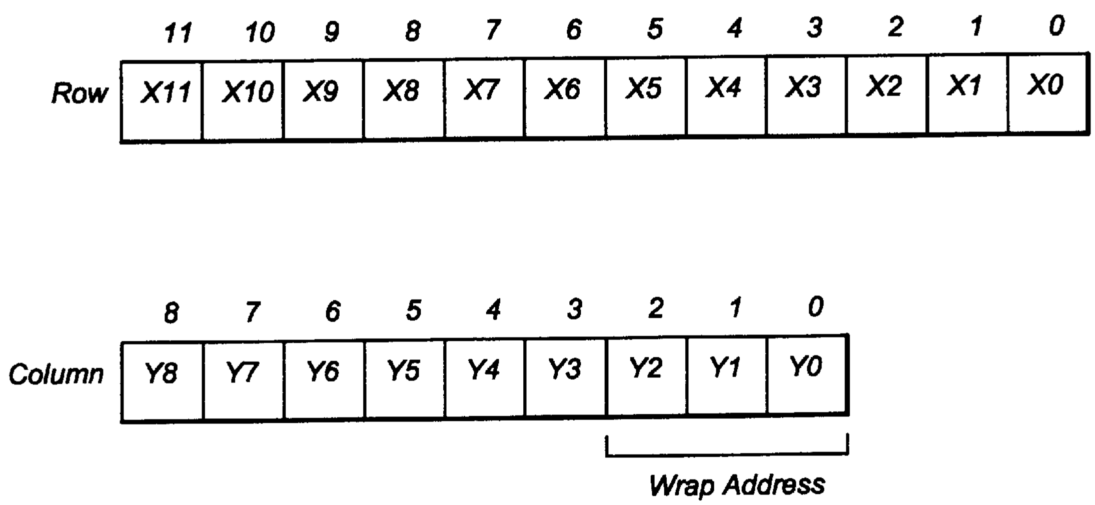
FIG. 7 is a schematic diagram showing an example of wrap address allocation in the conventional technology.

When both of the address inversion scramble function and the wrap conversion operation for testing the SDRAM are to be used, the present invention can be configured as shown in FIG. 5. In this example, the internal logic structure of the Y scramble memory 32 is formed of a combination of the logic circuit information for the sequential address mode of FIG. 3 and the logic circuit information for the scramble conversion. Further, the internal logic structure of the Y scramble memory 32 can be formed of a combination of the logic circuit information for the interleave address mode of FIG. 4 and the logic circuit information for the scramble conversion. In this case, however, a signal for separating the wrap conversion circuit from the scramble circuit cannot be taken out, and thus, a signal for failure analysis cannot be obtained. In the above embodiment, the wrap conversion function is performed in the Y scramble memory. However, it is also possible to include the wrap conversion function in the X scramble memory as well.

For each embodiment described above, the explanation is made for the case that the bit length of wrap address is 3 bit. However, an arbitrary bit length Y0–Yn and Z0–Zn can be used within the concept of the present invention.

Because of the configuration described above, a pattern program used in the pattern generator is not complicated and can be easily produced. Further, the pattern program can be commonly used in generating the wrap address between the sequential type and the interleave type because the pattern program in the pattern generator can be expressed by the normal increment method. As a consequence, the present invention is also effective to prevent mistakes in the coding or program creation.

INDUSTRIAL APPLICABILITY

Since it is configured as described in the foregoing, the present invention has the following effects.

A test pattern generation apparatus and method for easily generating the address signals for testing the SDRAM is achieved in which a pattern for the SDRAM can be generated by adding the wrap conversion circuit specifically arranged for the pattern generator, or by adding a method of converting the address from the pattern generator to the wrap address.

What is claimed is:

1. A test pattern generation apparatus for generating a test pattern to test a synchronous dynamic random access memory (SDRAM) characterized in that:

a wrap conversion means (40) is provided which receives two kinds of data (Y0–Yn and Z0–Zn) from a pattern generator (10) and converts the data based on predetermined logic circuit information.

2. A test pattern generation apparatus for a SDRAM as defined in claim 1, wherein said logic circuit information in said wrap conversion means is characterized in that:

an output (Y0–Y2) of said wrap conversion means is converted as expressed in the following when said two kinds of data (Y0–Yn and Z0–Zn) are given;

Y0=Y0. XOR. Z0

Y1=Y1. XOR. Z1

Y2=Y2. XOR. Z2.

3. A test pattern generation apparatus for a SDRAM as defined in claim 1 characterized in that:

an output (Y0–Y2) of said wrap conversion means is converted as expressed in the following when said two kinds of data (Y0–Yn and Z0–Zn) are given;

Y0=Y0. XOR. Z0

Y1=(Y0. AND. Z0). XOR. (Y1. XOR. Z1)

Y2=(((Y0. AND. Z0). AND. (Y1. XOR. Z1)). OR. (Y1. AND. Z1)). XOR. (Y2. XOR. Z2).

4. A test pattern generation method for generating a test pattern to test a synchronous dynamic RAM (SDRAM) characterized in that:

inputting column address data (Y0–Y2) from a pattern generator to a wrap address conversion circuit;

inputting wrap address data (Z0–Z2) from the pattern generator to the wrap address conversion circuit;

outputting a converted address (Y0–Y2) from the wrap address conversion circuit based on the following logic equations;

Y0=Y0. XOR. Z0

Y1=Y1. XOR. Z1

Y2=Y2. XOR. Z2.

5. A test pattern generation method for SDRAM as defined in claim 4 characterized in that an address inversion scramble is performed for the address (Y0–Y2) which have been address converted.

6. A test pattern generation method for generating a test pattern to test a synchronous dynamic RAM (SDRAM) characterized in that:

inputting column address data (Y0–Y2) from a pattern generator to a wrap address conversion circuit;

inputting wrap address data (Z0–Z2) from the pattern generator to the wrap address conversion circuit;

outputting a converted address (Y0–Y2) from the wrap address conversion circuit based on the following logic equations;

Y0=Y0. XOR. Z0

Y1=(Y0. AND. Z0). XOR. (Y1. XOR. Z1)

Y2=(((Y0. AND. Z0). AND. (Y1. XOR. Z1)). OR. (Y1. AND. Z1)). XOR. (Y2. XOR. Z2).

7. A test pattern generation method for SDRAM as defined in claim 6 characterized in that an address inversion scramble is performed for the address (Y2–Y2) which have been address converted.

* * * * *